United States Patent
Kao et al.

(10) Patent No.: US 10,319,557 B2
(45) Date of Patent: Jun. 11, 2019

(54) ION GENERATOR AND METHOD FOR USING THE SAME

(71) Applicant: Taiwan Semiconductor Manufacturing Co., Ltd., Hsinchu (TW)

(72) Inventors: Tai-Kun Kao, Hsinchu (TW); Tsung-Min Lin, Zhubei (TW); Jen-Chung Chiu, Hsinchu (TW); Ren-Dou Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/692,745

(22) Filed: Aug. 31, 2017

(65) Prior Publication Data

US 2019/0066967 A1  Feb. 28, 2019

(51) Int. Cl.
  *H01J 37/08* (2006.01)
  *H01J 37/317* (2006.01)
  *C01F 17/00* (2006.01)

(52) U.S. Cl.
  CPC .......... *H01J 37/08* (2013.01); *H01J 37/3171* (2013.01); *C01F 17/00* (2013.01)

(58) Field of Classification Search
  CPC .. H01J 27/02; H01J 27/08; H01J 27/26; H01J 37/08; H01J 37/3171; C01F 17/00
  See application file for complete search history.

(56) References Cited

U.S. PATENT DOCUMENTS

| | | | | |
|---|---|---|---|---|
| 5,703,372 A | * | 12/1997 | Horsky | H01J 27/08 250/423 R |
| 9,257,286 B2 | * | 2/2016 | Heiderman | H01L 21/265 |
| 2002/0100876 A1 | * | 8/2002 | Murakoshi | H01J 27/02 250/424 |
| 2008/0237496 A1 | * | 10/2008 | Gupta | H01J 37/08 250/492.21 |
| 2013/0140987 A1 | | 6/2013 | Hwang et al. | |
| 2014/0151572 A1 | * | 6/2014 | Lin | H01J 37/08 250/423 R |
| 2014/0227453 A1 | | 8/2014 | Wang et al. | |
| 2017/0330725 A1 | * | 11/2017 | Colvin | H01J 37/3002 |

* cited by examiner

*Primary Examiner* — David E Smith
(74) *Attorney, Agent, or Firm* — Birch, Stewart, Kolasch & Birch, LLP

(57) ABSTRACT

Ion generators for ion implanters are provided. The ion generator for an ion implanter includes an ion source arc chamber including an arc chamber housing and a thermal electron emitter coupled to the arc chamber housing. In addition, the thermal electron emitter includes a filament and a cathode, and the cathode has a solid top portion made of a work function modified conductive material including tungsten (W) and a work function modification metal.

20 Claims, 4 Drawing Sheets

ION GENERATOR AND METHOD FOR USING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

One of the important drivers for increased performance in the semiconductor devices is the higher levels of integration of circuits. This is accomplished by miniaturizing or shrinking device sizes on a given chip. Ion implant is a critical technology in the fabrication of semiconductor devices. Ion implantations are typically used for performing ion implantation processes. The ion implanters are used to provide doping for semiconductor devices, so that atoms can be introduced to change the electrical properties of semiconductor materials.

However, although existing ion implant processes have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
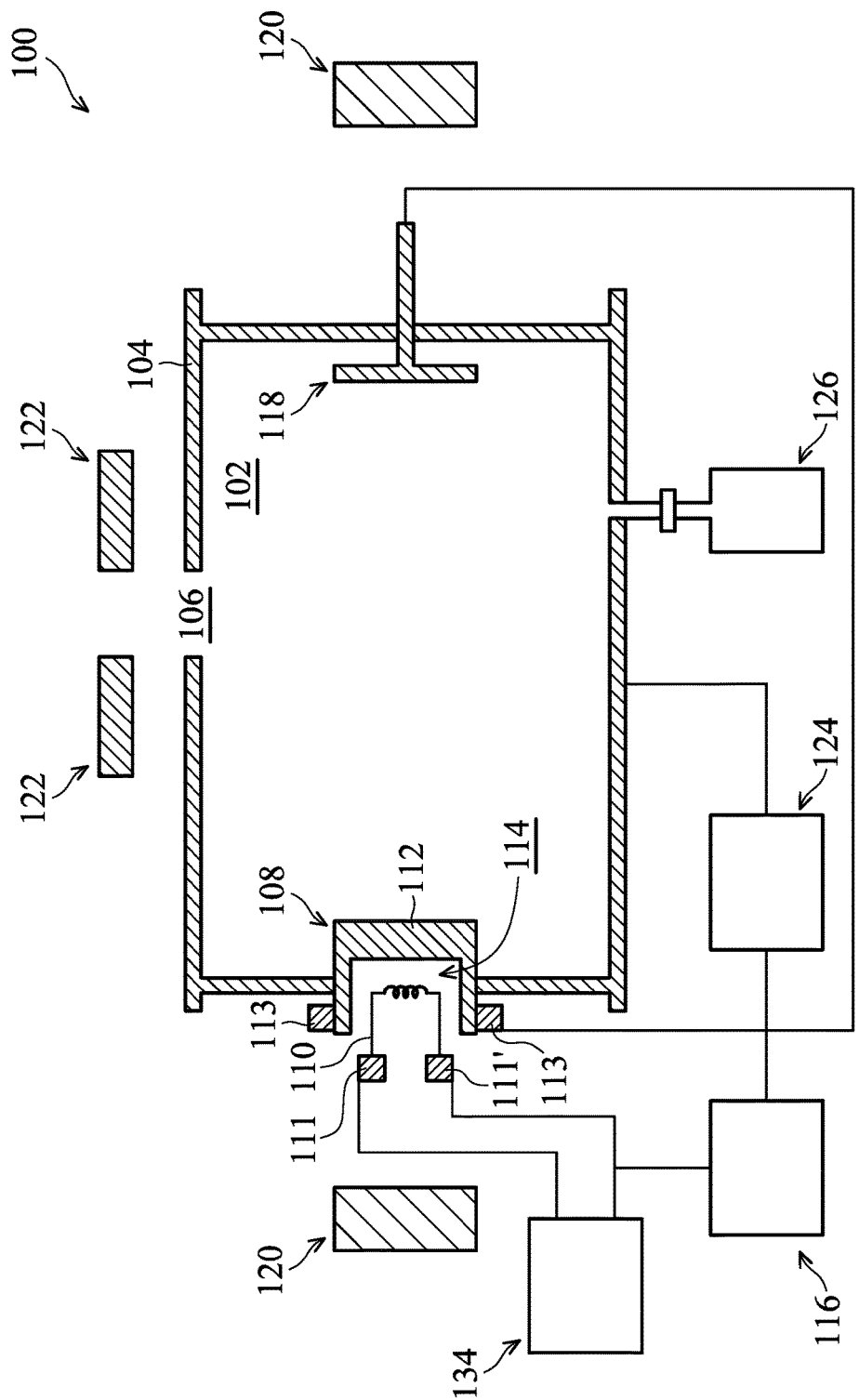
FIG. 1 is a schematic diagram of an ion generator in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of ion generators and applications thereof are provided. An ion generator may include a cathode for emitting electrons to form ions in the ion generator. In addition, the cathode may be made of a work function modified conductive material, such as an alloy of tungsten and a work function modification metal, so that the performance of the ion generator may be improved. In some embodiments, the ion generator is applied to an ion implanter, such as the ion implanter used in an implantation process for manufacturing a semiconductor structure.

FIG. 1 is a schematic diagram of an ion generator 100 in accordance with some embodiments. The ion generator 100 may be used in an ion implanter, such as an inductively heated cathode (IHC) ion source used in high current ion implantation equipment.

As shown in FIG. 1, the ion generator 100 includes an ion source arc chamber 102 in accordance with some embodiments. In addition, the ion source arc chamber 102 has an arc chamber housing 104 and an extraction opening 106 at a side of the arc chamber housing 104. The extraction opening 106 is configured to expel ions and/or other impurities generated in the ion source arc chamber 102. The arc chamber housing 104 may be made of a conductive material with a high melting point, so that the arc chamber housing 104 can be used under high-temperature conditions. Materials for forming the arc chamber housing 104 may include, but are not limited to, tungsten (W), molybdenum (Mo), and tantalum (Ta), an alloy of thereof, or graphite (C), although other conductive materials may additionally or alternatively be used to form the arc chamber housing 104.

A thermal electron emitter 108 is coupled to one side of the arc chamber housing 104 and is configured to emit thermal electrons into the ion source arc chamber 102, as shown in FIG. 1 in accordance with some embodiments. In some embodiments, the thermal electron emitter 108 includes a filament 110 and a cathode 112.

As shown in FIG. 1, the cathode 112 extrudes into the ion source arc chamber 102 from outside the arc chamber housing 114, so that one end of the cathode is positioned in the ion source arc chamber 102 while the other end of the cathode is positioned outside of ion source arc chamber 102. In some embodiments, a clamp 113 is clamped onto two sides of the cathode 112 to fix the cathode 112.

In some embodiments, the filament 110 is positioned in a hollow region 114 of the cathode 112 but is not in physical contact with the cathode 112. In some embodiments, clamps 111 and 111' are clamped on two ends of the filament 110 that extending outside the cathode 112, and a filament power supply 134 is connected to the clamps 111 and 111'.

The filament 110 is configured to heat the cathode 112. More specifically, the filament 110 is energized by the filament power supply 134 and the current passing through the filament 110 heats the filament 110 to produce thermal electrons in accordance with some embodiments.

The materials for forming the cathode 112 and/or the filament 110 may include work function modified conductive materials, so that the efficiency for emitting electrons from the cathode 112 and/or the filament 110 may be improved. (Details of the materials will be described later.)

A bias power supply 116 is used to bias the cathode 112 so the thermal electrons emitted from the filament 110 can be accelerated toward the cathode 112. As these electrons bombard the cathode 112, the cathode 112 will emit thermal electrons into the ion source arc chamber 102.

In addition, an arc power supply 124 is coupled to the arc chamber housing 104 in accordance with some embodiments. The arc power supply 124 is configured to bias the arc chamber housing 104 with respect to the cathode 112, so that the electrons are accelerated at a high energy in the ion source arc chamber 102. Therefore, the electrons emitted by the cathode 112 are accelerated, and plasma is formed within the ion source arc chamber 102.

A repeller 118 (or anticathode) is coupled to the arc chamber housing 104 in accordance with some embodiments. As shown in FIG. 1, the thermal electron emitter 108 is positioned at one side of the arc chamber housing 104, and the repeller 118 is positioned at the opposite side of the arc chamber housing 104. In addition, the repeller 118 at the other end of the arc chamber housing 104 may be biased at the same or a similar potential as the cathode 112 to repel energetic electrons formed in the ion source arc chamber 102. Materials for forming the repeller 118 may include, but are not limited to, tungsten, although other conductive materials may additionally or alternatively be used to form the repeller 118.

Source magnets 120 are provided outside the ion source arc chamber 102 in accordance with some embodiments. The source magnets 120 are configured to produce a magnetic field within the ion source arc chamber 102 and therefore to confine the energetic electrons formed in the ion source arc chamber 102. It should be noted that, although two source magnets 120 are illustrated in FIG. 1, one or more than two source magnets 120 may be utilized for generating a magnetic field in accordance with some other embodiments.

Extraction electrodes 122 are positioned in front of the extraction aperture 106 outside the ion source arc chamber 102 in accordance with some embodiments. The extraction electrodes 122 are configured to extract ions from the plasma formed in ion source arc chamber 102.

A gas source 126 is coupled to the arc chamber housing 104 in accordance with some embodiments. The gas source 126 is configured to introduce a gas to the ion source arc chamber 102. In some embodiments, the gas source 126 includes one or more gas bottles or reservoirs. In some other embodiments, the gas source 126 includes an oven that heats up a substance to produce a desired gas. In some embodiments, the gas source 126 is configured to apply a reactant gas and a diluent gas into the ion source arc chamber 102.

In the ion generator 100 described above, the cathode 112 will be consumed during the operation. Therefore, the life-span of the cathode 112 may be determined by the speed of the consumption of the cathode 112. Accordingly, the cathode 112 of the ion generator 100 may include a work function modified conductive material, so that the speed of the consumption of the cathode 112 may be reduced and the life-span of the cathode can be improved.

Figure 2:
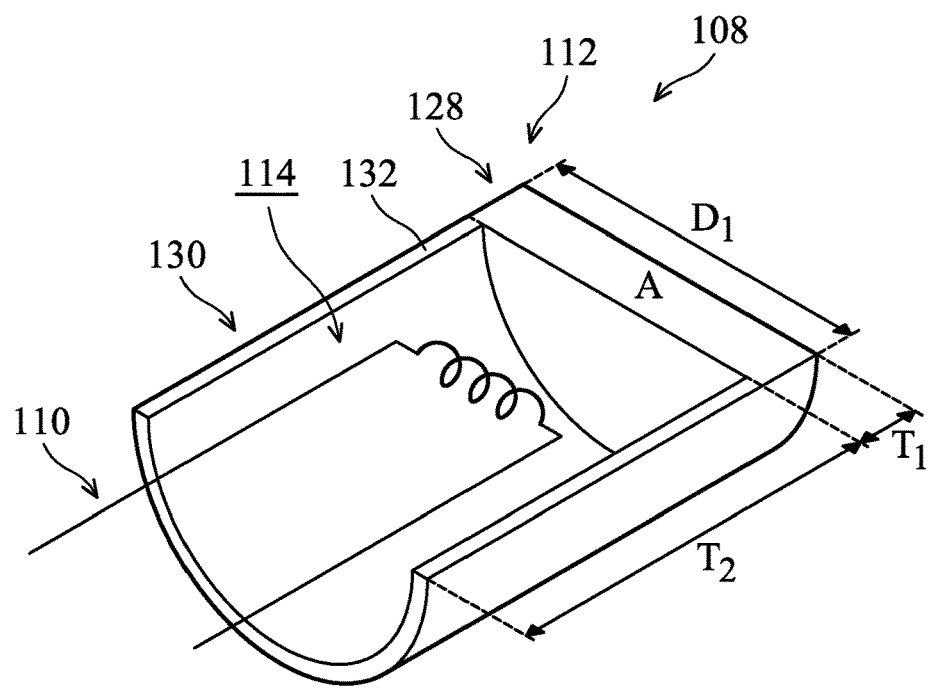
FIG. 2 is a cross-sectional representation of the thermal electron emitter shown in FIG. 1 in accordance with some embodiments.

FIG. 2 is a cross-sectional representation of the thermal electron emitter 108 shown in FIG. 1 in accordance with some embodiments. The cathode 112 of the thermal electron emitter 108 may have a cylindrical shape, although only a half of the cylindrical shape is shown in FIG. 2 for clarity.

The cathode 112 has a solid top portion 128 and a hollow bottom portion 130 in accordance with some embodiments. As shown in FIG. 2, the hollow bottom portion 130 includes the hollow region 114 surrounded by a cathode wall 132 in accordance with some embodiments.

The solid top portion 128 of the cathode 112 is configured to be heated by the thermal electrons emitted by the filament 110. In some embodiments, the solid top portion 128 of the cathode 112 is made of a work function modified conductive material including tungsten and a work function modification metal. The addition of the work function modification metal may help reduce the work function of the cathode 112, so that fewer thermal electrons are required for the cathode 112 to emit thermal electrons.

In some embodiments, the concentration of the work function modification metal in the work function modified conductive material is in a range from about 1.5 vol % to about 5 vol %. If the amount of work function modification metal in the solid top portion 128 is too high, the speed of the consumption of the solid top portion 128 of the cathode 112 may also increase, resulting in reducing the life-span of the cathode 112. On the other hand, if the amount of work function modification metal in the solid top portion 128 is too low, the thickness of the solid top portion 128 of the cathode 112 should be thinner, or the emitting rate of the thermal electrons may not be sufficient.

In some embodiments, the work function modification metal includes lanthanum (La), cerium (Ce), or thorium (Th). In some embodiments, the work function modified conductive material used to form the solid top portion 128 of the cathode 112 is an alloy including lanthanum and tungsten. The work function modification metal may be chosen to have a lower work function than that of tungsten, so that the work function of the cathode 112 may be reduced. However, not all of the metals having a low work function can be used as the work function modification metal to form the solid top portion 128 of the cathode 112. For examples, some metals, although also having relatively low work function, may not be applicable as the material for forming the cathode due to having high consumption rate when being used as a cathode.

On the other hand, La, having a relatively low work function, may be used as the work function modification metal because it is easy to obtain and to handle, and the consumption rate of the resulting solid top portion 128 will not be too high. In some embodiments, the difference between the work function of the work function modified conductive material and the work function of pure tungsten is greater than 1.5V, so that the current efficiency for the cathode 112 can be greatly improved. In addition, La has a relatively high atomic weight, and therefore contamination by impurities due to the material of the cathodes 112 can be reduced.

In some embodiments, the solid top portion 128 of the cathode 112 has a thickness $T_1$ in a range from about 2 mm to about 4 mm. In some embodiments, the solid top portion 128 of the cathode 112 has a thickness $T_1$ in a range from about 3.6 mm to about 4.0 mm. The thickness $T_1$ of the solid top portion 128 should be thick enough, or the life-span of the cathode 112 will be too short. On the other hand, the thickness $T_1$ of the solid top portion 128 should not be too thick, or the emitting rate of the thermal electrons may not be sufficient. The thickness $T_1$ of the solid top portion 128 is defined as the thickness of the solid top portion 128 of the cathode 112 measured along a sidewall of the cathode 112 in a direction vertical to the top surface of the cathode 112. For example, the thickness $T_1$ of the solid top portion 128 may be defined as the distance between the top surface of the solid top portion 128 and the bottom surface of the solid top portion 128 that is exposed by the hollow region 114 of the hollow bottom portion 130.

In some embodiments, the solid top portion 128 of the cathode 112 has a cross-section area A in a range from about 61.5 $mm^2$ to 63.9 $mm^2$. The cross-sectional area A of the solid top portion 128 may be related to the resistance of the cathode 112 and therefore determine the how much current is required to be provided from the filament 110. Therefore, the solid top portion 128 is designed to have a cross-sectional area A that will not require too much current (e.g. thermal electrons) from the filament 110 while the cathode 112 can still have a sufficient life-span. The cross-sectional area A of the solid top portion 128 may be defined as a rectangular area calculated by multiplying the thickness $T_1$ and the diameter $D_1$. More specifically, the solid top portion 128 may be cut through the diameter of the top surface of the solid top portion 128 in a direction vertical to the top surface of the solid top portion 128, and the shown rectangular area can be seen as the cross-sectional area A described above. In some embodiments, the diameter of the top surface of the solid top portion 128 of the cathode is in a range from about 3.75 mm to about 3.85 mm.

The hollow bottom portion 130 of the cathode 112 may also be made of a conductive material. In some embodiments, the hollow bottom portion 130 and the solid top portion 128 are integrally formed as one piece, and therefore the cathode wall 132 of the hollow bottom portion 130 and the solid top portion 128 are made of the same material, such as an alloy of La and W.

In some embodiments, the ratio of the thickness $T_1$ of the solid top portion 128 to the thickness $T_2$ of the hollow bottom portion 130 is in a range from about 1:13.4 to about 1:13.9. The ratio of the solid top portion 128 may be adjusted according to the physical/chemical properties of the material used to form the solid top portion, so that the resulting cathode 112 can have an improved life-span. Both the thickness $T_1$ of the solid top portion 128 to the thickness $T_2$ of the hollow bottom portion 130 may be measured along a sidewall of the cathode 112 vertical to the top surface of the solid top portion 128. In some embodiments, the thickness of the cathode wall 132 of the hollow bottom portion 130 is in a range from about 0.9 mm to about 1.0 mm.

As shown in FIG. 2, the filament 110 is fixed in the hollow region 114 of the cathode 112 by the clamps 111 and 111' and is not in physical contact with the cathode wall 132 or the solid top portion 128 of the cathode 112 in accordance with some embodiments. The filament 110 may be formed by bending a conductive wire into a spiral shape.

The filament 110 may also be made of a work function modified conductive material including tungsten and a work function modification metal. Similarly, the addition of the work function modification metal may help reduce the work function of the work function modified conductive material, so that fewer thermal electrons are required for the filament 110 to emit thermal electrons.

In some embodiments, the work function modification metal used to form the filament 110 includes lanthanum (La), cerium (Ce), or thorium (Th). In some embodiments, the work function modified conductive material used to form the filament 110 is an alloy of La and W. In some embodiments, the work function modified conductive material used to form the filament 110 is the same as that used to form the solid top portion 128 of the cathode 112. In some embodiments, the work function modified conductive material used to form the filament 110 is different from that used to form the solid top portion 128 of the cathode 112. For example, the concentration of the work function modification metal in the work function modified conductive material used to form the filament 110 may be different from the concentration of the work function modification metal in the work function modified conductive material used to form the solid top portion 128 of the cathode 112, although same work function modification metal may be used.

Figure 3:
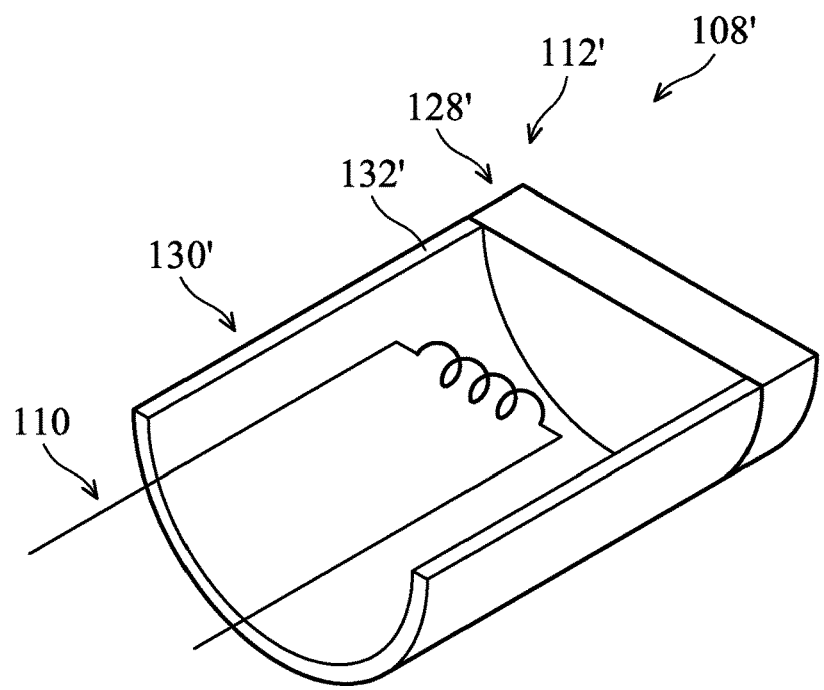
FIG. 3 is a cross-sectional representation of a thermal electron emitter similar to the thermal electron emitter shown in FIG. 2, except its solid top portion and its hollow bottom portion are formed separately in accordance with some embodiments.

FIG. 3 is a cross-sectional representation of a thermal electron emitter 108' similar to the thermal electron emitter 108 shown in FIG. 2, except its solid top portion 128' and its hollow bottom portion 130' are formed separately in accordance with some embodiments.

More specifically, the hollow bottom portion 130' and the solid top portion 128' are formed separately first and are soldered together afterwards. Similar to the thermal electron emitter 108, the thermal electron emitter 108' includes a cathode 112' and the filament 110, and the cathode 112' includes the solid top portion 128' and the hollow bottom portion 130' in accordance with some embodiments. In addition, the filament 110 is surrounded by a cathode wall 132' of the hollow bottom portion 130'.

In some embodiments, the solid top portion 128' is made of the work function modified conductive material including tungsten and a work function modification metal. The work function modified conductive material used to form the solid top portion 128' of the cathode 112' may be similar to, or the same as, that used to form the solid top portion 128 of the cathode 112 shown in FIG. 2 and is not repeated herein. In some embodiments, the cathode wall 132' of the hollow bottom portion 130' and the solid top portion 128' are made of the same material. In some embodiments, the hollow bottom portion 130' and the solid top portion 128' are made of different materials. In some embodiments, the cathode wall 132' of the hollow bottom portion 130' is made of pure tungsten.

It should be noted that the thermal electron emitter 108' shown in FIG. 3 may also be used in an ion generator, although it is not shown in the figure. In some embodiments, the thermal electron emitter 108' shown in FIG. 3 may be used to replace the thermal electron emitter 108 shown in the ion generator 100 shown in FIG. 1.

Figure 4:
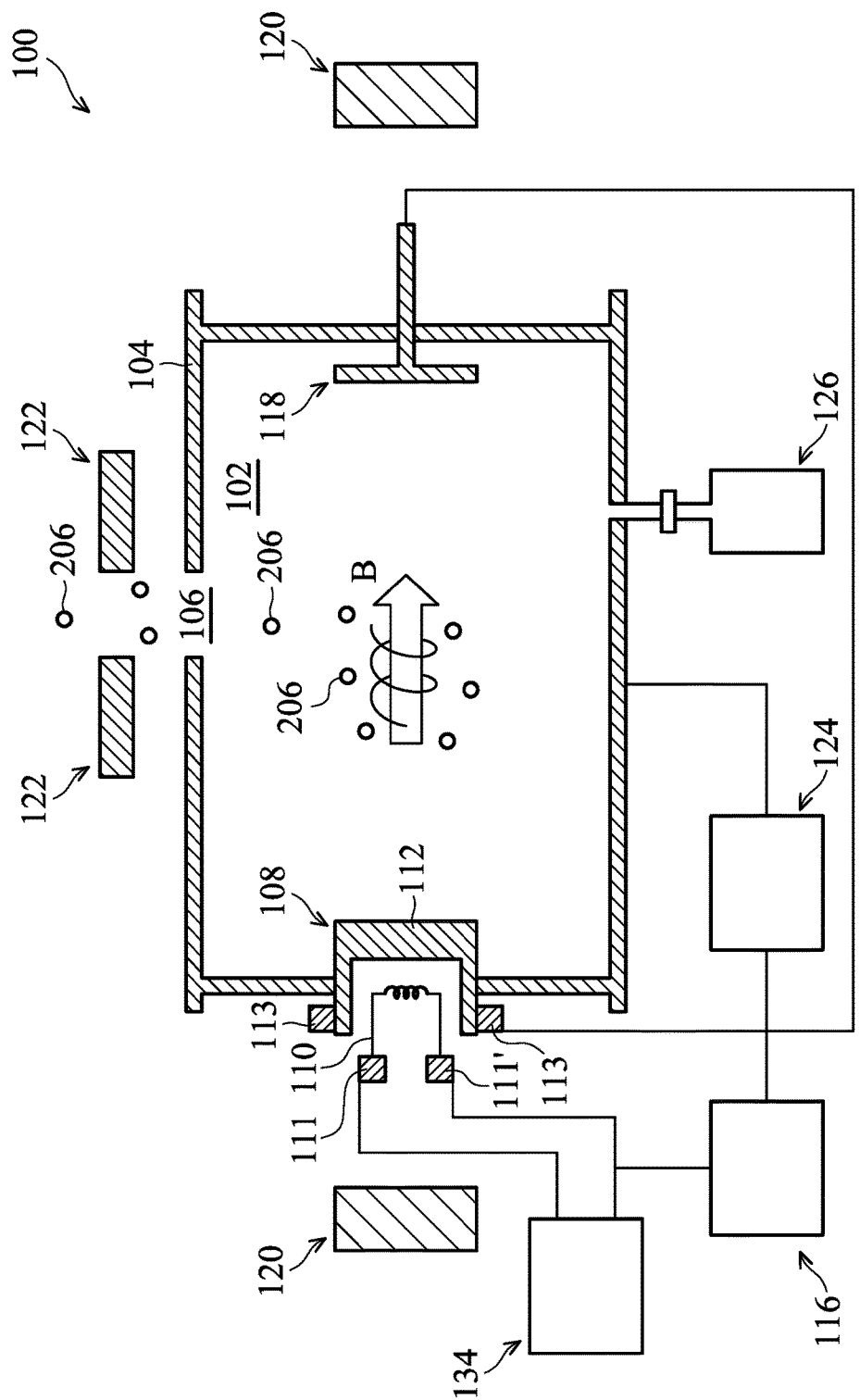
FIG. 4 is a schematic diagram of the ion generator shown in FIG. 1 during a process for generating ions in accordance with some embodiments.

FIG. 4 is a schematic diagram of the ion generator 100 shown in FIG. 1 during a process for generating ions in accordance with some embodiments. The gas source 126 is coupled to the arc chamber housing 104 and is configured to introduce a reactant gas into the ion source arc chamber 102 in accordance with some embodiments. The reactant gas may be a dopant gas, such as $CO_2$, CO, $GeF_4$, $BF_2$, $O_2$, $PH_3$, $NH_3$, $AsH_3$, for implanting into a semiconductor structure. In addition, a diluent gas, such as $H_2$, may also be introduced into the ion source arc chamber 102 through the gas source 126.

The reactant gas and the diluent gas may be introduced to the ion source arc chamber 102 via the same conduit. That is, the reactant gas and the diluent gas may be are pre-mixed in the conduit before entering the ion source arc chamber 102. Alternatively, the reactant gas and the diluent gas may be introduced into the ion source arc chamber 102 via different conduits. That is, the reactant gas and the diluent gas may be mixed in the ion source arc chamber 102.

After the reactant gas is introduced to the ion source arc chamber 102, the filament 110 is heated to a thermionic emission temperature by the filament power supply 134, and electrons emitted by the filament 110 bombard the cathode 112 in accordance with some embodiments. In addition, the cathode 112 is also heated to the thermionic emission temperature, and electrons are emitted from the cathode 112.

Afterwards, the electrons emitted by the cathode 112 are accelerated, and gas molecules of the reactant gas are ionized accordingly. As a result, plasma is generated in the ion source arc chamber 102 by collision between the reactant gas and the electrons. In some embodiments, the electrons formed in the ion source arc chamber 102 follows a spiral trajectory of a magnetic field B to increase the number of ionizing collisions. In addition, the repeller 118 may build up a negative charge to repel the electrons back through the ion source arc chamber 102 for producing additional ionizing collisions.

The resulting ions of the reactant gas 206 are extracted from the plasma in accordance with some embodiments. More specifically, the ions of the reactant gas 206 are extracted from the ion source arc chamber 102 through the extraction aperture 106 by the extraction electrodes 122.

As described previously, the cathode 112 includes the solid top portion 128, as shown in FIG. 2, and the solid top portion 128 is made of a work function modified conductive material including tungsten and a work function modification metal in accordance with some embodiments. Therefore, during the operation of the ion generator 100, ions of the work function modification metal may also be formed. In some embodiments, the ions of the work function modification metal are lanthanum ions.

Since the ions of the work function modification metal are formed in the ion source arc chamber 102, they may be mixed with the ions of the reactant gas 206 and may also be extracted from the ion source arc chamber 102 through the extraction aperture 106 by the extraction electrodes 122. Therefore, the ions of the work function modification metal and the ions of the reactant gas should be separated before subsequent process, such as an implanting process used for manufacturing a semiconductor structure, is performed. Accordingly, the work function modification metal may be chosen to have a relatively high molecular weight, so that the difference of the molecular weight of the reactant gas and the molecular weight of the work function modification metal can be relatively large and therefore they can be easily separated afterwards.

In some embodiments, the difference of the molecular weight of the reactant gas and the molecular weight of the work function modification metal is greater than 30. For examples, the ions of the reactant gas may be such as C, Ge, B, As, N ions or the like, and the molecular weights of these ions are relatively low, compared to such as lanthanum ions. In some embodiments, the difference of the molecular weight of the reactant gas and the molecular weight of the work function modification metal is greater than 50. Since the difference of the molecular weight of the reactant gas and the molecular weight of the work function modification metal is relatively large and the ions of the reactant gas and the work function modification metal can be easily separated, contamination from the cathodes 112 during subsequent implanting processes may be reduced.

Furthermore, since the ions of the ions of the work function modification metal are mixed with the ions of the reactant gas in the ion source arc chamber 102, the work function modification metal should be reluctant from reacting with the ions of the reactant gas, so that the ions of the reactant gas can be extracted from the ion generator with a higher purity.

Figure 5:
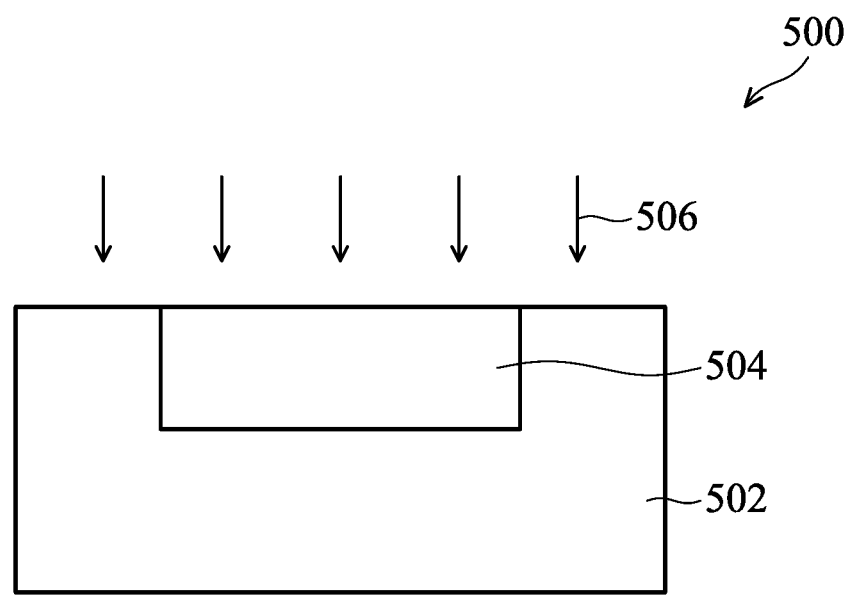
FIG. 5 illustrates a cross-sectional representation of a method for manufacturing a semiconductor structure in accordance with some embodiments.

FIG. 5 illustrates a cross-sectional representation of a method for manufacturing a semiconductor structure 500 in accordance with some embodiments. More specifically, the ions of the reactant gas 206 extracted from the ion source arc chamber 102 illustrated in FIG. 4 is further used to implant a semiconductor substrate 502 in accordance with some embodiments.

The semiconductor substrate 502 may be a semiconductor wafer such as a silicon wafer. Alternatively or additionally, the semiconductor substrate 502 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the semiconductor substrate 502 includes structures such as isolation features, transistors, and/or conductive features. In some embodiments, the semiconductor structure 502 includes a fin structure and a gate structure formed over the fin structure (not shown).

In some embodiments, the ions of the reactant gas 206 shown in FIG. 4 are implanted to the semiconductor substrate 502. A doped region 504 is formed in the semiconductor substrate 502. In some embodiments, the doped region 504 is formed by forming a photoresist layer or sacrificial layer over the semiconductor substrate 502 and performing an implantation process 506 through an opening of the photoresist layer or the sacrificial layer. As described previously, the semiconductor substrate 502 may include a fin structure and a gate structure formed across the fin structure, and the doped region 504 may be formed in the fin structure adjacent to the gate structure as a source/drain region for a transistor structure.

It should be noted that the ions of the reactant gas 206 extracted from the ion source arc chamber 102 may be further processed before the implantation process 506 is performed. For example, the ions of the reactant gas 206 extracted from the ion source arc chamber 102 are first filtered and purified to remove other ions such as the ions of the work function modification metal, and the implantation process 506 is performed afterwards.

Since the ions of the reactant gas 206 may be extracted from the ion source arc chamber 102 with a higher efficiency and the resulting ions may have a higher purity, the performance of the implantation process 506 used to form the semiconductor structure 500 may also be improved accordingly.

As described previously, electrons are emitted from a cathode in an ion generator to ionize the atoms of a reactant gas applied to the ion generator. In order to generate the electrons, the cathode will also be consumed during the operation of the ion generator. Therefore, the cathode in an ion generator needs to be replaced constantly.

Accordingly, in some embodiments of the disclosure, the solid top portion 128 of the cathode 112 is made of the work function modified conductive material, so that the life-span of the cathode 112 can be increased. It is found that the life span of the cathode 112 increases 37.5%, compared to the cathode made of pure tungsten, in accordance with some embodiments.

More specifically, the work function modified conductive material may include the work function modification metal having a relative low work function than pure tungsten, so that the work function modified conductive material can also have a relatively low work function, such as lower than that of pure tungsten. Since the work function modified conductive material used to form the solid top portion 128 of the cathode has the relatively low work function, less electrons are required from the filament 110 for the cathode 112 to emit sufficient electrons to form the plasma. That is, the current efficiency of the thermal electron emitter 108 is improved. It is found that the current efficiency of the thermal electron emitter 108 increases 3.3%, compared to the thermal electron emitter including a cathode made of pure tungsten, in accordance with some embodiments.

In addition, since the work function modified conductive material used to form the solid top portion 128 of the cathode has the relatively low work function, emitting the electrons from the cathode 112 may become easier, such as compared to the cathode made of pure tungsten. Therefore, the thickness of the solid top portion 128 of the cathode may become relatively large, while still having enough current efficiency for emitting the electrons.

Furthermore, in some embodiments, the work function modification metal in the work function modified conductive material is chosen to have a relatively low work function but a relatively high molecular weight, so that the ions of the work function modification metal can be easily separated from the ions of the reactant gas. In addition, in some embodiments, the work function modification metal in the work function modified conductive material is chosen to have a low or none reactivity with the reactant gas, so that the purity of the extracted ions may be improved. Accordingly, the extracted ions may be used in an implanting process for manufacturing a semiconductor structure, and the performance of the semiconductor structure may also be improved.

Embodiments of ion generators are provided. The ion generator may include a cathode including a solid top portion and a hollow bottom portion. The solid top portion of the cathode may be made of a work function modified conductive material including tungsten and a work function modification metal. By using the work function modification metal in the solid top portion of the cathode, the work function of the solid top portion of the cathode can be relatively low. Accordingly, the current efficiency of the ion generator may be improved and the life span of the cathode may be elongated.

In some embodiments, an ion generator for an ion implanter is provided. The ion generator for an ion implanter includes an ion source arc chamber including an arc chamber housing and a thermal electron emitter coupled to the arc chamber housing. In addition, the thermal electron emitter includes a filament and a cathode, and the cathode has a solid top portion made of a work function modified conductive material including tungsten (W) and a work function modification metal.

In some embodiments, an ion generator for an ion implanter is provided. The ion generator for an ion implanter includes an arc chamber housing and a cathode coupled to a first side of the arc chamber housing. In addition, the cathode includes a solid top portion and a hollow bottom portion. The ion generator for an ion implanter further includes a filament fixed in a hollow region surrounding by a cathode wall of the hollow bottom portion of the cathode. In addition, the solid top portion of the cathode is made of a material including tungsten and lanthanum.

In some embodiments, a method for generating ions in an ion generator is provided. The method for generating ions in an ion generator includes introducing a reactant gas into an ion source arc chamber and emitting electrons from a cathode coupled to an arc chamber housing of the ion source arc chamber. The method for generating ions in an ion generator further includes generating plasma by collision between the reactant gas and the electrons. In addition, the cathode includes a solid top portion made of a material including tungsten and lanthanum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion generator for an ion implanter, comprising:
   an ion source arc chamber comprising an arc chamber housing; and
   a thermal electron emitter coupled to the arc chamber housing, wherein the thermal electron emitter comprises a filament and a cathode,
   wherein the cathode has a solid top portion and a hollow bottom portion connected to the solid top portion, and the solid top portion is made of a work function modified conductive material comprising tungsten (W) and a work function modification metal, and the filament is also made of the work function modified conductive material, and a ratio of a thickness of the solid top portion to a thickness of the hollow bottom portion is in a range from about 1:13.4 to about 1:13.9.

2. The ion generator for an ion implanter as claimed in claim 1, wherein the work function modification metal comprises lanthanum (La), Cerium (Ce), or thorium (Th).

3. The ion generator for an ion implanter as claimed in claim 1, wherein the work function modified conductive material is an alloy of lanthanum and tungsten.

4. The ion generator for an ion implanter as claimed in claim 1, wherein the solid top portion and the hollow bottom portion are made of different materials.

5. The ion generator for an ion implanter as claimed in claim 4, wherein the filament is disposed in a hollow region of the hollow bottom portion of the cathode and is not in physical contact with the cathode.

6. The ion generator for an ion implanter as claimed in claim 1, wherein a concentration of the work function modification metal in the work function modified conductive material is in a range from about 1.5 vol % to about 5 vol %.

7. The ion generator for an ion implanter as claimed in claim 1, wherein the solid top portion of the cathode has a rectangular cross-sectional area in a range from about 61.5 mm² to about 63.9 mm².

8. The ion generator for an ion implanter as claimed in claim 1, wherein the thickness of the solid top portion is in a range from about 2 mm to about 4 mm.

9. A method for generating ions in an ion generator, comprising:
   introducing a reactant gas into an ion source arc chamber;
   heating a filament to emit first electrons from the filament, and the first electrons bombard a cathode to emit second electrons, wherein the cathode is coupled to an arc chamber housing of the ion source arc chamber; and
   generating plasma by collision between the reactant gas and the second electrons,
   wherein the cathode comprises a solid top portion and a hollow bottom portion connected to the solid top portion, and the solid top portion is made of a first material comprising tungsten and lanthanum, and a ratio of a thickness of the solid top portion of the cathode to a thickness of the hollow bottom portion of the cathode is in a range from about 1:13.4 to about 1:13.9, and the filament is made of a second material comprising tungsten and lanthanum.

10. An ion generator for an ion implanter, comprising:
    an arc chamber housing;
    a cathode coupled to a first side of the arc chamber housing, wherein the cathode comprises a solid top portion and a hollow bottom portion; and
    a filament fixed in a hollow region surrounded by a cathode wall of the hollow bottom portion of the cathode,
    wherein the solid top portion of the cathode is made of a material comprising tungsten and lanthanum, and a ratio of a thickness of the solid top portion of the cathode to a thickness of the hollow bottom portion of the cathode is in a range from about 1:13.4 to about 1:13.9.

11. The ion generator for an ion implanter as claimed in claim 10, wherein the solid top portion of the cathode has a rectangular cross-sectional area in a range from about 61.5 mm² to about 63.9 mm².

12. The ion generator for an ion implanter as claimed in claim 10, further comprising:
    a repeller coupled to a second side of the arc chamber housing opposite to the first side of the arc chamber housing; and
    a gas source coupled to a third side of the arc chamber housing.

13. The ion generator for an ion implanter as claimed in claim 10, wherein the solid top portion of the cathode has a thickness measured along a direction vertical to a top surface of the solid top portion of the cathode in a range from about 2 mm to about 4 mm.

14. The ion generator for an ion implanter as claimed in claim 10, wherein a concentration of lanthanum in the work function modified conductive material is in a range from about 1.5 vol % to about 5 vol %.

15. The ion generator for an ion implanter as claimed in claim 10, wherein the solid top portion and the hollow bottom portion are made of different materials.

16. The ion generator for an ion implanter as claimed in claim 10, wherein the filament is made of a work function modified conductive material comprising tungsten and lanthanum.

17. The method for generating ions in an ion generator as claimed in claim 9, further comprising:
    forming lanthanum ions from the solid top portion of the cathode in the ion source arc chamber; and
    extracting the lanthanum ions from the ion source arc chamber.

18. The method for generating ions in an ion generator as claimed in claim 9, wherein a difference of a molecular weight of the reactant gas and a molecular weight of the lanthanum is greater than 30.

19. The method for generating ions in an ion generator as claimed in claim 9, wherein a concentration of lanthanum in the work function modified conductive material is in a range from about 1.5 vol % to about 5 vol %.

20. The method for generating ions in an ion generator as claimed in claim 9, wherein a concentration of lanthanum in the first material is different from a concentration of lanthanum in the second material.

* * * * *